US012225707B2

(12) United States Patent
Su et al.

(10) Patent No.: US 12,225,707 B2
(45) Date of Patent: Feb. 11, 2025

(54) METHOD FOR MANUFACTURING SEMICONDUCTOR STRUCTURE, SEMICONDUCTOR STRUCTURE AND SEMICONDUCTOR MEMORY

(71) Applicant: CHANGXIN MEMORY TECHNOLOGIES, INC., Hefei (CN)

(72) Inventors: Xingsong Su, Hefei (CN); Weiping Bai, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 411 days.

(21) Appl. No.: 17/819,817

(22) Filed: Aug. 15, 2022

(65) Prior Publication Data
US 2023/0328955 A1  Oct. 12, 2023

Related U.S. Application Data

(63) Continuation of application No. PCT/CN2022/099844, filed on Jun. 20, 2022.

(30) Foreign Application Priority Data

Mar. 28, 2022 (CN) .......................... 202210316932.1

(51) Int. Cl.
*H10B 12/00* (2023.01)

(52) U.S. Cl.
CPC .......... *H10B 12/038* (2023.02); *H10B 12/37* (2023.02)

(58) Field of Classification Search
CPC ......... H01L 29/66818; H01L 29/66545; H01L 21/76897; H10B 12/038
See application file for complete search history.

(56) References Cited

U.S. PATENT DOCUMENTS

| 11,189,707 | B2 * | 11/2021 | Kang | ................ H01L 29/66795 |
| 2020/0020567 | A1 * | 1/2020 | Sun | .................... H01L 21/31053 |
| 2022/0328622 | A1 * | 10/2022 | Cai | ................ H01L 21/823468 |
| 2023/0171940 | A1 * | 6/2023 | Xiao | ..................... H10B 12/482 |
| | | | | 257/296 |
| 2023/0225126 | A1 * | 7/2023 | Lue | ........................ H01L 29/792 |
| | | | | 257/314 |
| 2024/0121954 | A1 * | 4/2024 | Hu | ......................... H10B 43/35 |

FOREIGN PATENT DOCUMENTS

| CN | 114695271 A | * | 7/2022 | ....... H01L 27/10829 |
| JP | 2008010866 A | * | 1/2008 | ............. H01L 28/91 |
| WO | WO-2022068264 A1 | * | 4/2022 | ............. H01L 28/90 |

* cited by examiner

*Primary Examiner* — Edward Chin
(74) *Attorney, Agent, or Firm* — Syncoda LLC; Feng Ma

(57) ABSTRACT

A method for manufacturing a semiconductor structure includes: providing a substrate; patterning the substrate to form a substrate layer and a plurality of silicon pillars; forming an oxide layer on a surface of the substrate layer between the plurality of silicon pillars; forming an isolation structure on the oxide layer, gaps being provided between upper part of the isolation structure and the silicon pillars; forming a first conductive layer in the gaps; partially removing the isolation structure and retaining the isolation structure below the first conductive layer to form an isolation layer; and forming a dielectric layer and a second conductive layer on surfaces of the isolation layer, the oxide layer, the first conductive layer and the silicon pillars.

20 Claims, 22 Drawing Sheets

_METHOD FOR MANUFACTURING SEMICONDUCTOR STRUCTURE, SEMICONDUCTOR STRUCTURE AND SEMICONDUCTOR MEMORY_

CROSS-REFERENCE OF RELATED APPLICATIONS

The present application is a U.S. continuation application of International Application No. PCT/CN2022/099844 filed on Jun. 20, 2022, which claims priority to Chinese Patent Application No. 202210316932.1 filed on Mar. 28, 2022. International Application No. PCT/CN2022/099844 and Chinese Patent Application No. 202210316932.1 are hereby incorporated by reference in their entirety.

BACKGROUND

Capacitor is the part of dynamic random access memory (DRAM) used to store data, and the data value of each memory cell is interpreted from the charge carried by its capacitor. However, with the increasing integration of the DRAM, the size and area of the capacitor also decrease relatively.

SUMMARY

The technical solution of the disclosure is realized as follows.

In a first aspect, embodiments of the disclosure provide a method for manufacturing a semiconductor structure, including the following operations.

A substrate is provided.

The substrate is patterned to form a substrate layer and a plurality of silicon pillars.

An oxide layer is formed on a surface of the substrate layer between the plurality of silicon pillars.

An isolation structure is formed on the oxide layer, and gaps are provided between upper part of the isolation structure and the silicon pillars.

A first conductive layer is formed in the gaps.

The isolation structure is partially removed, and the isolation structure below the first conductive layer is retained to form an isolation layer.

A dielectric layer and a second conductive layer are formed on surfaces of the isolation layer, the oxide layer, the first conductive layer and the silicon pillars.

In a second aspect, embodiments of the disclosure provide a semiconductor structure that is manufactured by the manufacturing method as described in the first aspect.

In a third aspect, embodiments of the disclosure provide a semiconductor memory including a semiconductor structure as described in the second aspect.

DETAILED DESCRIPTION

Figure 1:
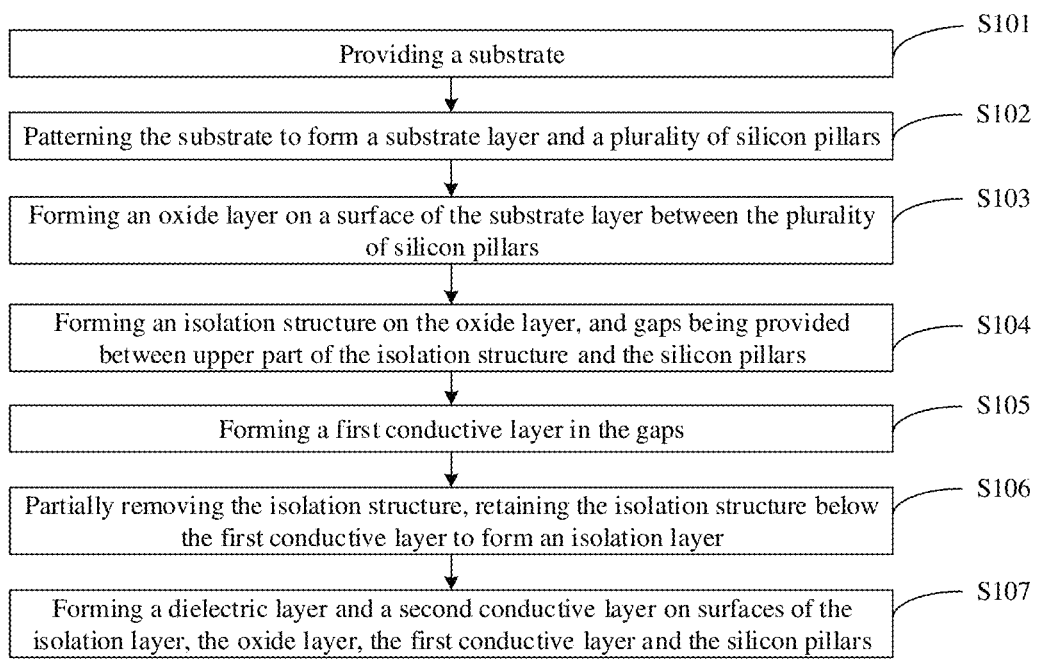
FIG. 1 is a flow chart of a method for manufacturing a semiconductor structure provided by embodiments of the disclosure.

The disclosure relates to a method for manufacturing a semiconductor structure, a semiconductor structure and a semiconductor memory.

A clear and complete description of the technical solutions of the embodiments of the disclosure will be provided below with reference to the drawings in the embodiments of the disclosure. It could be understood that the specific embodiments described herein are intended only to explain the relevant disclosure and not to limit the disclosure. In addition, it should be noted that for convenience of description, only parts related to the relevant disclosure are shown in the drawings.

Unless otherwise defined, all technical and scientific terms used herein have the same meanings as are commonly understood by those skilled in the art of the present disclosure. Terms used herein are for the purpose of describing embodiments of the disclosure only and are not intended to limit the disclosure.

In the following description, reference is made to "some embodiments" that describe a subset of all possible embodiments, but it could be understood that "some embodiments" may be the same subset or different subsets of all possible embodiments and may be combined with each other without conflict.

It should be pointed out that, the terms "first\second\third" involved in embodiments of the disclosure is used only to distinguish similar objects, without representing a particular sequence of objects, it could be understood that "first\second\third" may be interchanged in a particular order or priority order where permitted, so that the embodiments of the disclosure described herein can be implemented in an order other than that illustrated or described herein.

With the increasing integration of the DRAM, the size and area of the capacitor of the DRAM also decrease relatively. For example, with the development of semiconductor industry towards higher device density and higher performance, 3 Dimension (3D) semiconductor devices, such as 3D memory, have been developed. With the development of 3D semiconductor devices, it is necessary to develop capacitors for 3D semiconductor devices. However, the process for manufacturing capacitors in 3D memory is complex and costly, which often cannot meet the practical needs.

On the basis of this, embodiments of the disclosure provide a method for manufacturing a semiconductor structure. The basic idea of this method is that: a substrate is provided; the substrate is patterned to form a substrate layer and a plurality of silicon pillars; an oxide layer is formed on a surface of the substrate layer between the plurality of silicon pillars; an isolation structure is formed on the oxide layer, and gaps are provided between an upper part of the isolation structure and the silicon pillars; a first conductive layer is formed in the gaps; part of the isolation structure is removed, the isolation structure below the first conductive layer is retained to form an isolation layer; a dielectric layer and a second conductive layer are formed on surfaces of the isolation layer, the oxide layer, the first conductive layer and the silicon pillars. In this way, when manufacturing a semiconductor structure, a gap is formed between the silicon pillar and the isolation structure, and a first conductive layer is formed in the gap, then part of the isolation structure is removed to obtain the isolation layer, and then a dielectric layer and a second conductive layer are further formed. This manufacturing method has a simple process, is easy to implement, and can improve the manufacturing yield.

The embodiments of the disclosure will be described in detail below with reference to the drawings.

Before the detailed description, it should be noted that, in the description of the following embodiments, the corresponding relationship between the reference numerals used in the drawings and each component in the semiconductor structure is as follows:

10: substrate; 11: substrate layer; 12: silicon pillar; 131: first mask layer; 1311: first trench; 132: second mask layer; 1321: second trench; 133: intermediate structure; 134: sub-mask; 141: initial oxide layer; 14: oxide layer; 151: initial first isolation structure; 15: first isolation structure; 16: sacrificial layer; 171: initial second isolation structure; 17: second isolation structure; 181: initial first conductive layer; 18: first conductive layer; 19: isolation layer; 20: dielectric layer; 21: second conductive layer.

In embodiments of the disclosure, referring to FIG. 1, FIG. 1 illustrates a flow chart of a method for manufacturing a semiconductor structure provided by embodiments of the disclosure. As shown in FIG. 1, the method includes the following operations.

In S101, a substrate is provided;

It should be noted that the embodiments of the disclosure provide a method for manufacturing a semiconductor structure; the semiconductor structure may be a capacitor that may be applied to a semiconductor device having a 3D structure (e.g. a 3D DRAM structure). The method can be applied to a transistor on the capacitor (TOC) architecture for forming capacitors in the architecture.

Figure 2:
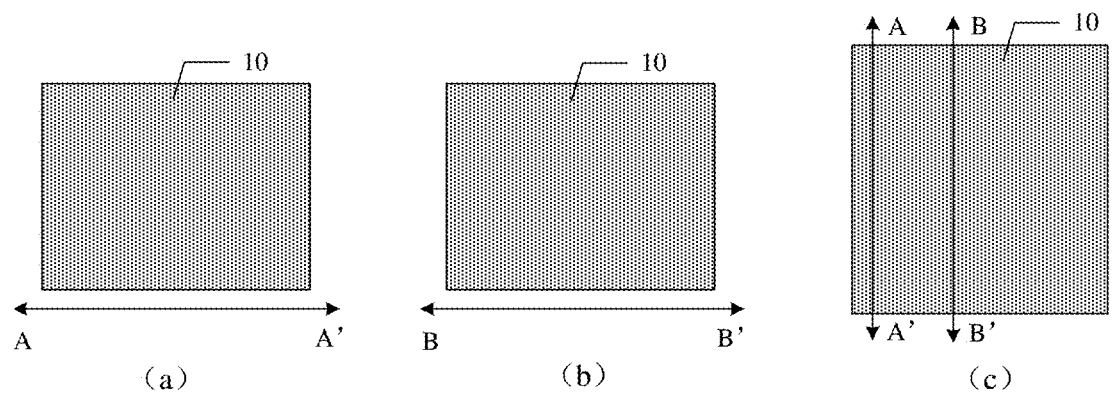
FIG. 2 is a schematic structural diagram of a substrate provided by an embodiment of the disclosure.

Referring to FIG. 2, FIG. 2 is a schematic structural diagram of the substrate 10 provided by embodiments of the disclosure. Herein, (a) and (b) are cross-sectional views, and (c) is a top view; (a) is a cross-sectional view along AA' direction in (c), and (b) is a cross-sectional view along BB' direction in (c).

It should also be noted that the substrate 10 may be a silicon substrate or be made of other suitable substrate material such as silicon, germanium, silicon-germanium compound, or the like, for example, a doped or undoped monocrystalline silicon substrate, a polysilicon substrate, or the like, which is not specifically limited. In the embodiments of the disclosure, a silicon substrate is described as an example.

In S102, the substrate is patterned to form a substrate layer and a plurality of silicon pillars.

It should be noted that the substrate 10 is patterned and divided into two parts: a substrate layer 11 and a plurality of silicon pillars 12. Herein, the upper part of the substrate 10 is patterned to form the plurality of silicon pillars 12, and the lower part of the substrate 10 is not patterned and forms a substrate layer 11.

Figure 3:
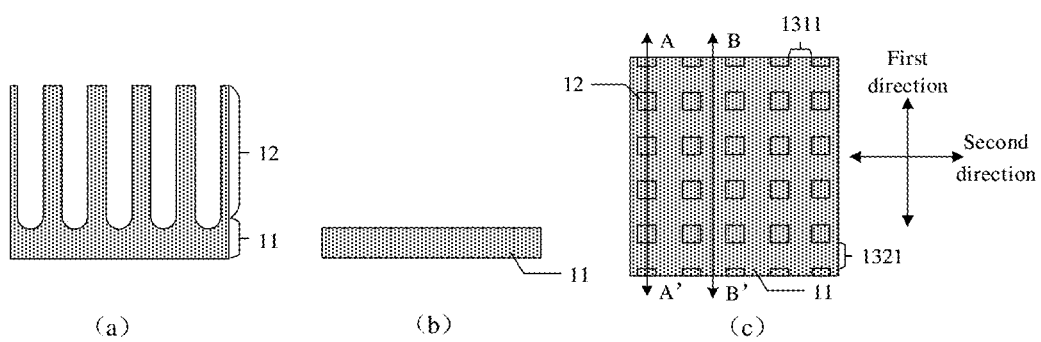
FIG. 3 is a schematic diagram of a structure obtained after forming a substrate layer and silicon pillars provided by embodiments of the disclosure.

Referring to FIG. 3, FIG. 3 is a schematic diagram of a structure obtained after forming the substrate layer 11 and the silicon pillars 12 provided by embodiments of the disclosure, in which (a) and (b) are cross-sectional views, and (c) is a top view; (a) is a cross-sectional view along AA' direction in (c), and (b) is a cross-sectional view along BB' direction in (c).

That is, (a) is a cross-sectional diagram in which the silicon pillars 12 are formed in the first direction, and (b) is a cross-sectional diagram between two adjacent ones of the silicon pillars 12 in the first direction, that is, a cross-sectional diagram in which the silicon pillars 12 are not formed. In addition, same as FIG. 3, in the figures related to the following operations, (a) in the figures are all cross-sectional views in AA' direction, (b) in the figures are cross-sectional views in BB' direction, and (c) in the figures are all top views, which will not be repeated hereafter.

As shown in FIG. 3, after the substrate 10 is patterned, the upper part of the substrate 10 is partially removed to form a plurality of silicon pillars 12, and the part of the substrate 10 remaining under the plurality of silicon pillars 12 forms the substrate layer 11. As shown in (a) of FIG. 3, a gap is formed between two adjacent ones of the silicon pillars 12 in AA' direction; as shown in (b) of FIG. 3, no silicon pillar 12 is presented on the substrate layer 11 in BB' direction; as shown in (c) of FIG. 3, a plurality of silicon pillars 12 are formed in this structure as can be seen from a top view.

Herein, the thickness of the substrate layer 11 and the height of the silicon pillars 12 can be set according to the specific requirements of the actual process level, which is not limited by the embodiments of the disclosure.

For the plurality of silicon pillars 12, in some embodiments, the plurality of silicon pillars 12 are arranged in an array.

It should be noted that the plurality of silicon pillars 12 can be arranged in a regular array. For example, as shown in FIG. 3, the plurality of silicon pillars 12 are regularly arranged in a first direction and a second direction, and the included angle between the first direction and the second direction is 90°, and in this case, the silicon pillar 12 with a square cross section can be formed. In addition, the included angle between the first direction and the second direction may be another angle, for example, an angle of 60°, and in this case, the silicon pillar 12 with a diamond or another shape in cross section can be formed.

Since a plurality of silicon pillars 12 are formed in a regular array arrangement, the processing can be relatively simple and easy to realize when the substrate is patterned.

When the substrate 10 is patterned, in one possible implementation, patterning the substrate to form the substrate layer 11 and the plurality of silicon pillars 12 may include the following operations.

A first mask layer 131 is formed on the substrate 10, in which the first mask layer 131 has a first pattern extending in a first direction.

The first pattern is transferred to part of the substrate 10 by taking the first mask layer 131 as a mask.

A second mask layer 132 is formed on the substrate 10, in which the second mask layer 132 has a second pattern extending in a second direction.

The second pattern is transferred to part of the substrate 10 by taking the second mask layer 132 as a mask to form the substrate layer 11 and the plurality of silicon pillars 12.

It should be noted that when the substrate 10 is patterned, the substrate 10 may be patterned twice to form the plurality of silicon pillars 12. Specifically, the first pattern is transferred to the substrate 10 to obtain a substrate 10 having the first pattern, and then the second pattern is transferred to the substrate 10 already having the first pattern. The first pattern and the second pattern divide the substrate 10 into a plurality of silicon pillars 12, and the remaining part of substrate 10 forms the substrate layer 11.

Figure 4:
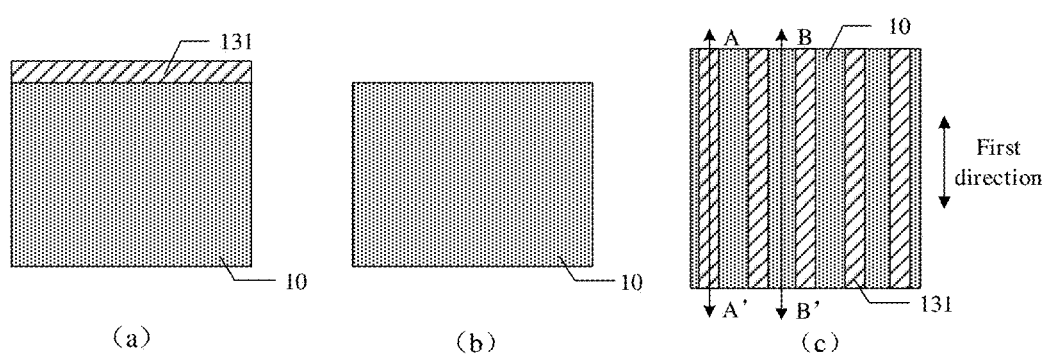
FIG. 4 is a schematic diagram of a structure obtained after forming a first mask layer provided by embodiments of the disclosure.

Referring to FIG. 4, FIG. 4 is a schematic diagram of a structure obtained after forming a first mask layer 131 provided by embodiments of the disclosure. As shown in (c) of FIG. 4, the first mask layer 131 has a first pattern extending in the first direction; as shown in (a) of FIG. 4, a mask material is formed on the substrate 10 in AA' direction; as shown in (b) of FIG. 4, no mask material is formed on the substrate 10 in BB' direction.

Figure 5:
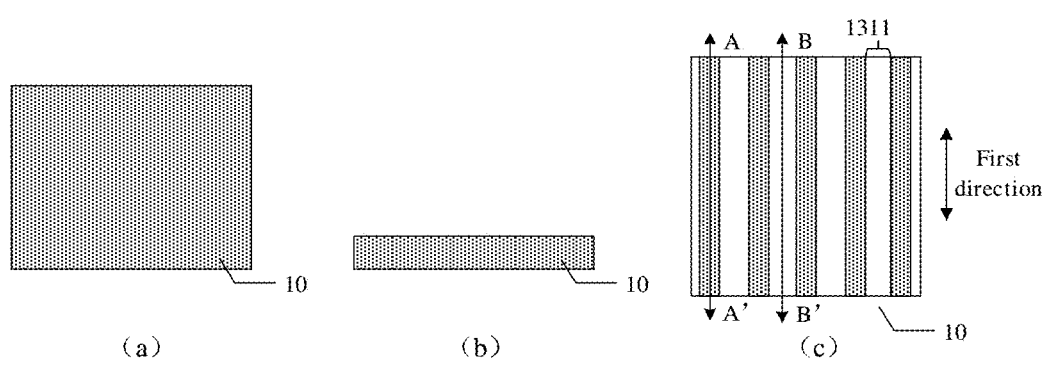
FIG. 5 is a schematic diagram of a structure obtained after transferring the first pattern provided by embodiments of the disclosure.

The first pattern is transferred to the substrate 10 to form a plurality of first trenches 1311 in the substrate 10, and the first mask layer 131 is removed. Referring to FIG. 5, FIG. 5 is a schematic diagram of a structure obtained after transferring the first pattern provided by embodiments of the disclosure. As shown in FIGS. 4 and 5, the first pattern is transferred to part of the substrate 10 by taking the first mask layer 131 as a mask, and the part that the first pattern is transferred to is the part for forming a plurality of silicon pillars 12. Here, part of the substrate 10 not covered with a mask material may be removed by etching to a certain height, thereby forming a plurality of first trenches 1311 in the substrate 10. After the first pattern is transferred to the substrate 10, the first mask layer 131 is removed.

As shown in (a) of FIG. 5, the height of the substrate 10 is unchanged in AA direction, or may be slightly reduced due to partial loss when the first mask layer 131 is removed; as shown in (b) of FIG. 5, the upper part of the substrate 10 is removed in BB' direction, and the height thereof is significantly reduced.

In addition, as shown in (c) of FIG. 5, in order to distinguish between removed and non-removed parts in the substrate 10, part of the substrate 10 with the first trenches 1311 formed will be shown in a non-filling pattern, but it will be understood that although shown with non-filling pattern, the material of this part is the same as that of the remaining part.

Figure 6:
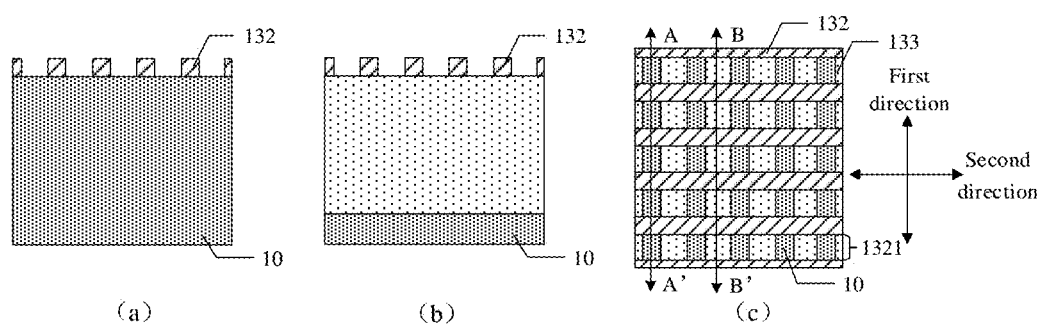
FIG. 6 is a schematic diagram of a structure obtained after forming a second mask layer provided by embodiments of the disclosure.

After the first pattern is transferred to the substrate 10, the second pattern is formed on the substrate 10. Referring to FIG. 6, FIG. 6 is a schematic diagram of a structure obtained after forming a second mask layer 132 provided by embodiments of the disclosure. As shown in FIGS. 5 and 6, when forming the second mask layer 132, intermediate structures 133 may be formed in the first trenches 1311, or the height of the intermediate structure 133 may also be higher than the height of the first trenches 1311 to completely fill the first trenches 1311 and cove the substrate 10.

Taking FIG. 6 as an example, the intermediate structures 133 fill the first trenches 1311. Next, the second mask layer 132 is formed on the intermediate structure s133 and the substrate 10, and the second mask layer 132 has a second pattern extending in the second direction. In FIG. 6, the included angle between the second direction and the first direction is 90°, in practice, the included angle may also be set to other angles according to actual requirements, which is not limited by the embodiments of the disclosure.

As shown in (a) of FIG. 6, the second mask layer 132 is formed on the substrate 10 in AA direction; as shown in (b) of FIG. 6, the second mask layer 132 is formed on the intermediate structure 133 in BB' direction.

The second pattern is transferred to the substrate 10 and the intermediate structure 133 by taking the second mask layer 132 as a mask, and the second mask layer 132 and the intermediate structure 133 are removed; herein, the transfer depth of the second pattern is the same as that of the first pattern. Thus, the substrate layer 11 and the plurality of silicon pillars 12 are formed.

As shown in FIG. 3, the transfer of the second pattern in the substrate 10 forms the second trenches 1321, and the first trenches 1311 and the second trenches 1321 together form a gap between the silicon pillars 12.

It should be noted that the intermediate structure 133 may be a material that is easier to remove by etching than the substrate 10, thereby ensuring that the intermediate structure 133 can be completely removed.

When the substrate 10 is patterned, in another possible implementation, patterning the substrate to form the substrate layer 11 and the plurality of silicon pillars 12 may include the following operations.

A third mask layer is formed on the substrate 10; the third mask layer includes a plurality of sub-masks 134 arranged in an array, and the third mask layer has a third pattern composed of a first pattern extending in a first direction and a second pattern extending in a second direction.

The third pattern is transferred to part of the substrate 10 by taking the third mask layer as a mask to form the substrate layer 11 and the plurality of silicon pillars 12.

It should be noted that the embodiments of the disclosure can also pattern the substrate 10 only once to obtain a plurality of silicon pillars 12. First, a third mask layer is formed on the substrate 10, the third mask layer having a third pattern composed of a first pattern extending in a first direction and a second pattern extending in a second direction; herein, the included angle between the first direction and the second direction may be 90° or other angles which are not specifically limited in the embodiments of the disclosure. The third pattern is transferred to the substrate 10, in this way the substrate layer 11 and the plurality of silicon pillars 12 are obtained.

Figure 7:
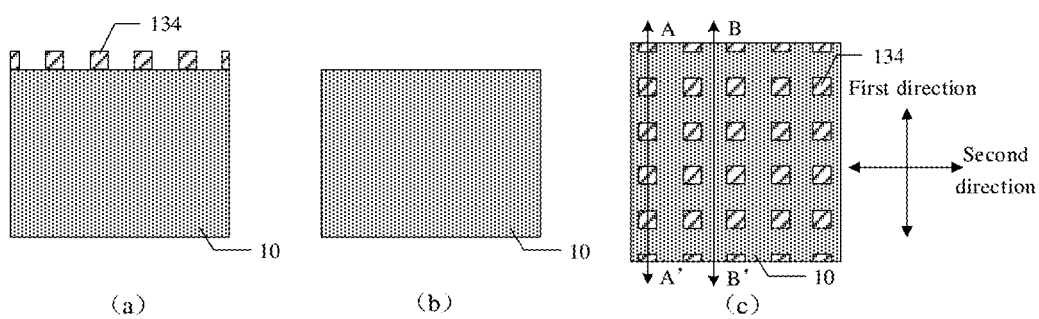
FIG. 7 is a schematic diagram of a structure obtained after forming a third mask layer provided by embodiments of the disclosure.

Referring to FIG. 7, FIG. 7 is a schematic diagram of a structure obtained after forming a third mask layer provided by embodiments of the disclosure. In FIG. 7, as shown in (c) of FIG. 7, the third mask layer is composed of a plurality of sub-masks 134 that may be arranged in a regular array, the included angle between the first direction and the second direction is 90°, and the position of each sub-mask 134 is the position where corresponding silicon pillar 12 is subsequently formed. As shown in (a) of FIG. 7, a plurality of sub-masks 134 are formed on the substrate 10 in AA' direction; as shown in (b) of FIG. 7, no sub-mask 134 is formed on the substrate 10 in BB' direction.

The third pattern is transferred to the substrate 10 to a certain height by taking the third mask layer as a mask. In this way, the substrate is divided into an upper part and a lower part, in which the upper part forms a plurality of silicon pillars 12 and the lower part forms the substrate layer 10. The structure after forming the substrate layer 11 and the plurality of silicon pillars 12 is shown in FIG. 3.

It should also be noted that as shown in FIG. 3, when the substrate 10 is patterned, the surface of the substrate layer 11 between the silicon pillars 12 may be formed into an arc shape as shown in the figure.

It should also be noted that all the first mask layer 131, the second mask layer 132 and the third mask layer may be formed by deposition. The material of the mask layer may be photoresist or the like, and the mask layer can be a single layer, or a composite mask material may be selected in combination with the actual situation. When performing operations such as pattern transfer and mask layer removal, the process adopted may be etching, which is not specifically limited in the embodiments of the disclosure.

In S103, an oxide layer is formed on a surface of the substrate layer between the plurality of silicon pillars.

It should be noted that after patterning, the substrate 10 is divided into a plurality of silicon pillars 12 in the upper part and a substrate layer 11 in the lower part, and then an oxide layer 14 is formed on the surface of the substrate layer 11 between the plurality of silicon pillars 12.

In some embodiments, forming the oxide layer 14 on the surface of the substrate layer 11 between the plurality of silicon pillars 12 includes the following operations.

An initial oxide layer 141 is formed on surfaces of the plurality of silicon pillars 12 and a surface of the substrate layer 11 between the plurality of silicon pillars 12.

The initial oxide layer 141 on the surfaces of the plurality of silicon pillars 12 is removed, and the remaining initial oxide layer 141 forms the oxide layer 14.

Figure 8:
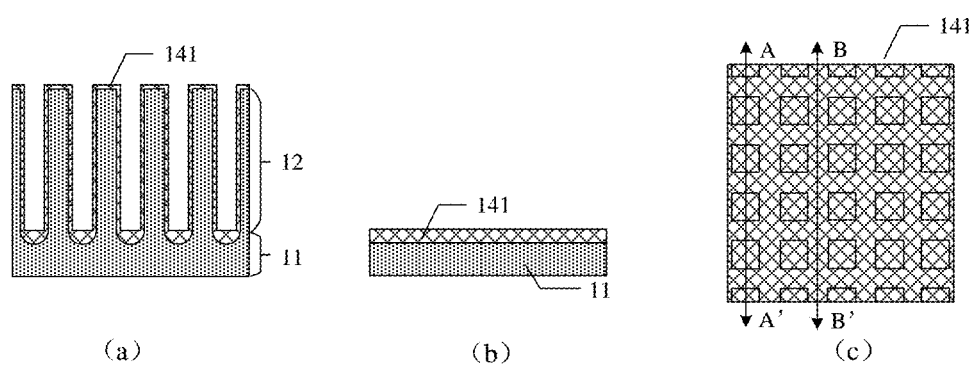
FIG. 8 is a schematic diagram of a structure obtained after forming an initial oxide layer provided by embodiments of the disclosure.

It should be noted that during forming the oxide layer 14, an initial oxide layer 141 is first formed. Referring to FIG. 8, FIG. 8 is a schematic diagram of a structure obtained after forming an initial oxide layer 141 provided by embodiments of the disclosure. As shown in FIG. 8, the initial oxide layer 141 is formed on the surfaces of the plurality of silicon pillars 12 (in FIG. 8, the surface of the silicon pillars 12 include the top surface and four side surfaces of each silicon pillar 12) and on the surface of the substrate layer 11 between the plurality of silicon pillars 12. The initial oxide layer 141 covers the top surfaces and four side surfaces of each silicon pillar 12.

As shown in (a) of FIG. 8, it can be seen that in AA' direction, the initial oxide layer 141 is formed on the surface of the substrate layer 11 and on the surfaces of the silicon pillars 12; as shown in (b) of FIG. 8, it can be seen that in BB' direction, no silicon pillar is present, and the initial oxide layer 141 is formed on the surface of the substrate layer 11; as shown in (c) of FIG. 8, in the top view direction, the initial oxide layer 141 completely covers the substrate layer 11 and the plurality of silicon pillars 12, and in (c), the profile of the initial oxide layer 141 formed on the top surface of the silicon pillars 12 is shown with a box in order to better show the positions of the silicon pillars 12.

It should be noted that the material of the initial oxide layer 141 may be an oxide, in the embodiments of the disclosure, the material of the initial oxide layer 141 may be silicon oxide, and the process of forming the initial oxide layer 141 may be deposition (Dep), such as chemical vapor deposition (CVD), physical vapor deposition (PVD), or the like.

Figure 9:
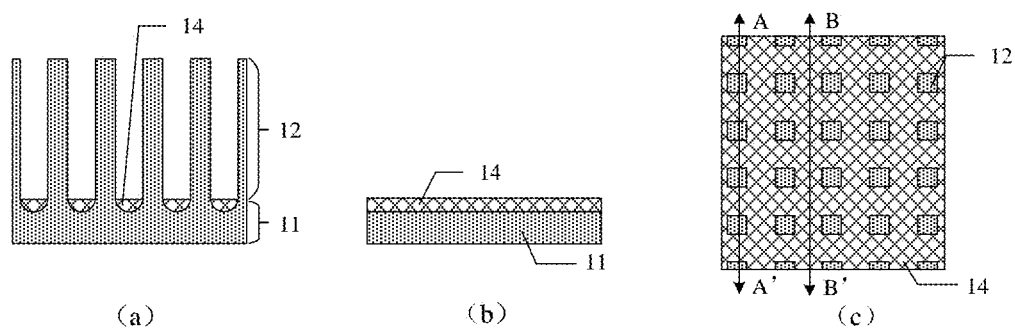
FIG. 9 is a schematic diagram of a structure obtained after forming an oxide layer provided by embodiments of the disclosure.

Part of the initial oxide layer 141 is removed, and the remaining part of the initial oxide layer 141 forms the oxide layer 14. Referring to FIG. 9, FIG. 9 is a schematic diagram of a structure obtained after forming an oxide layer 14 provided by embodiments of the disclosure. As shown in FIGS. 8 and 9, the initial oxide layer 141 on the top surface and the side surfaces of each silicon pillar 12 is removed, leaving only the initial oxide layer 141 formed on the surface of the substrate layer 11, and the remaining initial oxide layer 141 forms the oxide layer 14. Herein, the initial oxide layer 141 may be removed by etching.

In S104, an isolation structure is formed on the oxide layer, and gaps are provided between an upper part of the isolation structure and the silicon pillars.

It should be noted that an isolation structure is formed on the oxide layer 14, and gaps are provided between an upper part of the isolation structure and the silicon pillars 12. That is, a "circle gap" is formed between the four sides of each silicon pillar and the isolation structure.

In some embodiments, forming the isolation structure on the oxide layer 14 includes the following operations.

A first isolation structure 15 is formed on the surface of the oxide layer 14.

A second isolation structure 17 is formed on the first isolation structure 15, gaps are provided between the second isolation structure 17 and the silicon pillars 12, and the first isolation structure 15 and the second isolation structure 17 constitute the isolation structure.

It should be noted that the isolation structure may be composed of the first isolation structure 15 and the second isolation structure 17. During forming the isolation structure, a first isolation structure 15 is first formed on the surface of the oxide layer 14, and then a second isolation structure 17 is formed on the first isolation structure 15. The second isolation structure 17 is formed between the plurality of silicon pillars 12 and gaps are formed between the second isolation structure 17 and the silicon pillars 12. That is, the gaps between the isolation structure and the silicon pillars 12 refers to the gaps between the second isolation structure 17 and the silicon pillars 12.

Further, for the first isolation structure 15, in some embodiments, forming the first isolation structure 15 on the surface of the oxide layer 14 includes the following operations.

An initial first isolation structure 151 is formed on the surface of the oxide layer 14 and a surface of each of the silicon pillars 12.

The initial first isolation structure 151 is partially removed, and the remaining part of the initial first isolation structure 151 on the surface of the oxide layer 14 forms the first isolation structure 15.

Figure 10:
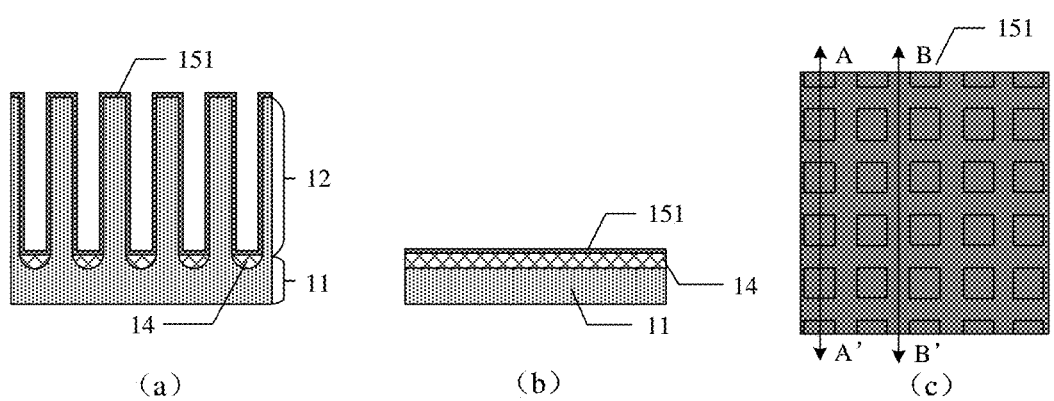
FIG. 10 is a schematic diagram of a structure obtained after forming an initial first isolation structure provided by embodiments of the disclosure.

It should be noted that during forming the first isolation structure 15, an initial first isolation structure 151 is first formed. Referring to FIG. 10, FIG. 10 is a schematic diagram of a structure obtained after forming an initial isolation structure 151 provided by embodiments of the disclosure. As shown in FIG. 10, the initial first isolation structure 151 is formed on the surface of the oxide layer 14 and on a surface of each of the silicon pillars 12. The initial first isolation structure 151 covers the top surfaces and four side surfaces of each of the silicon pillars 12.

As shown in (a) of FIG. 10, it can be seen that in AA' direction, the initial first isolation structure 151 is formed on the surface of the oxide layer 14 and on the surfaces of the silicon pillars 12; as shown in (b) of FIG. 10, it can be seen that in BB' direction, the initial isolation structure 151 is formed on the surface of the oxide layer 14; as shown in (c) of FIG. 10, in the top view direction, the initial isolation structure 151 completely covers the oxide layer 14 and the plurality of silicon pillars 12, and in (c), the profile of the initial first isolation structure 151 formed on the top surface of the silicon pillars 12 is shown with a box in order to better show the positions of the silicon pillars 12.

It should be noted that the material of the initial first isolation structure 151 may be silicon nitride, and the process for forming the initial first isolation structure 151 may be deposition, such as CVD, PVD, or the like.

The initial first isolation structure 151 is partially removed, and the remaining part of the initial first isolation structure 151 forms the first isolation structure 15.

Figure 11:
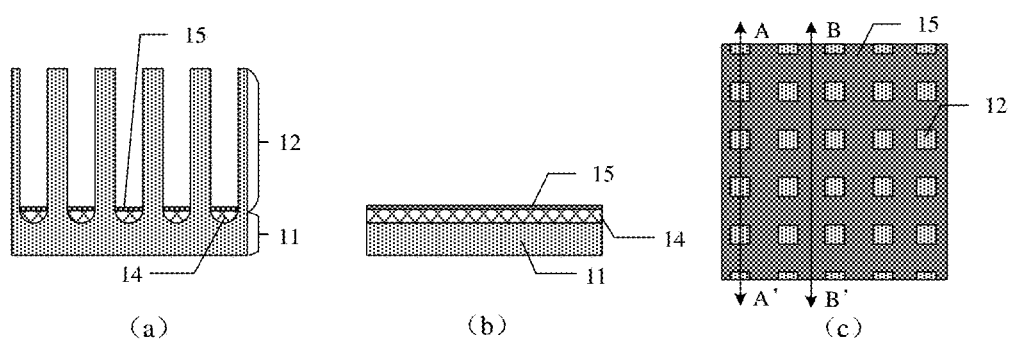
FIG. 11 is a schematic diagram of a structure obtained after forming a first isolation structure provided by embodiments of the disclosure.

Referring to FIG. 11, FIG. 11 is a schematic diagram of a structure obtained after forming a first isolation structure 15 provided by embodiments of the disclosure. As shown in FIGS. 10 and 11, the initial isolation structure 151 located on the top surface of each silicon pillar 12 is removed, and the part of the initial first isolation structure 151 located on the side surfaces of each silicon pillar 12 is removed, leaving only the initial first isolation structure 151 formed on the surface of the oxide layer 14, and the remaining part of the initial first isolation structure 151 forms the first isolation structure 15. That is, the first isolation structure 15 completely covers the oxide layer 14 and is in direct contact with the adjacent silicon pillars 12.

Herein, the initial first isolation structure 151 may be removed by etching.

For the second isolation structure 17, in some embodiments, forming the second isolation structure 17 on the first isolation structure 15 includes the following operations.

Sacrificial layers 16 are formed on surfaces the silicon pillars 12.

An initial second isolation structure 171 is formed on surfaces of the sacrificial layers 16 and on the first isolation structure 15.

The initial second isolation structure 171 above a plane where top surfaces of the sacrificial layers 16 are located is removed, and the remaining part of the initial second isolation structure 171 forms the second isolation structure 17.

The sacrificial layers 16 are removed to form the gaps between the isolation structure and the silicon pillars 12.

Figure 12:
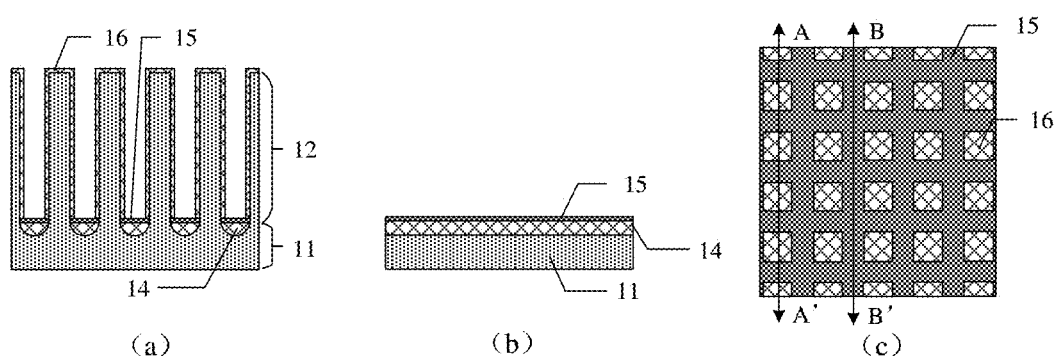
FIG. 12 is a schematic diagram of a structure obtained after forming a sacrificial layer provided by embodiments of the disclosure.

It should be noted that during forming the second isolation structure 17, the sacrificial layers 16 are first formed on the surfaces of the plurality of silicon pillars 12. Referring to FIG. 12, FIG. 12 is a schematic diagram of a structure obtained after forming sacrificial layers 16 provided by embodiments of the disclosure. As shown in FIG. 12, the sacrificial layers 16 are formed on the surfaces of each silicon pillar 12, specifically on the top surface and four side surfaces of each silicon pillar 12. That is, the sacrificial layers 16 are formed only on the surfaces of the silicon pillars 12 while covering part of the first isolation structure 15 adjacent to the silicon pillars 12, but are not formed on entire surface of the first isolation structure 15.

As shown in (a) of FIG. 12, it can be seen that in AA' direction, the sacrificial layers 16 are formed on the top surfaces and the side surfaces of the silicon pillars 12; as shown in (b) of FIG. 12, it can be seen that in BB' direction, no silicon pillar 12 is present, and the sacrificial layers 16 are not formed on the surface of the first isolation structure 15 (except part of the surface adjacent to the position in contact with the silicon pillar 12), so that the sacrificial layers 16 cannot be seen in BB' direction; as shown in (c) of FIG. 12, in the top view direction, the sacrificial layers 16 completely cover the plurality of silicon pillars 12, and the gaps between the sacrificial layers 16 exposes the first isolation structure 15.

It should be noted that the material of the sacrificial layer 16 may be oxide, such as silicon oxide. In some embodiments, the sacrificial layers 16 may also be formed by thermal oxidation.

It should be noted that the sacrificial layers 16 and the oxide layer 14 may be of the same material, for example both of which are made of silicon oxide. Therefore, they both are represented by filling with the same pattern in the drawings. When the sacrificial layers 16 are formed in this operation, the process adopted may be thermal oxidation, so that the surfaces of the silicon pillars 12 can be directly oxidized to form silicon oxide, so as to obtain the sacrificial layers 16, without complicated process treatment, which is beneficial to simplifying the process. In contrast, if the sacrificial layer is formed by deposition, the sacrificial layers will also cover the surface of the first isolation structure 15, and it is thus necessary to try to remove this part of the sacrificial layer, thereby resulting in a complicated process.

Figure 13:
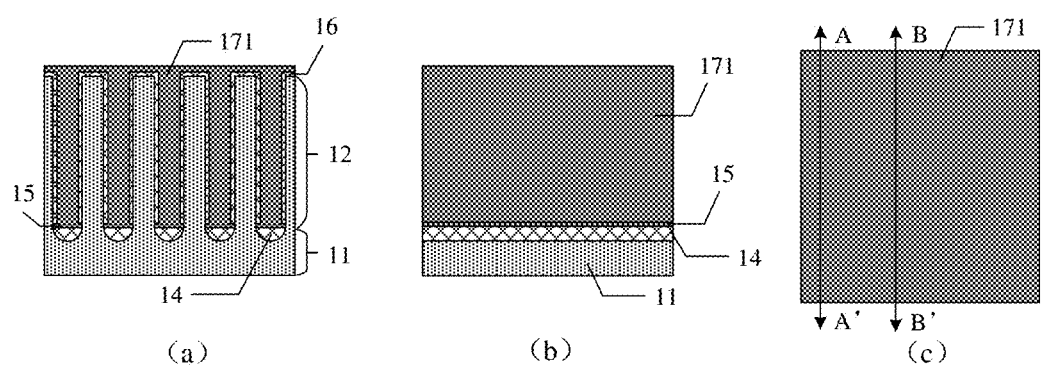
FIG. 13 is a schematic diagram of a structure obtained after forming an initial second isolation structure provided by embodiments of the disclosure.

After the sacrificial layers 16 are formed, the initial second isolation structure 171 is formed. Referring to FIG. 13, FIG. 13 is a schematic diagram of a structure obtained after forming an initial second isolation structure 171 provided by embodiments of the disclosure. As shown in FIG. 13, an initial second isolation structure 171 is formed on surfaces of the sacrificial layers 16 and on the first isolation structure 15. In FIG. 13, the initial second isolation structure 171 completely covers the sacrificial layers 16 and the first isolation structure 15 and fills the gaps between the sacrificial layers 16.

As shown in (a) of FIG. 13, it can be seen that in AA' direction, the initial second isolation structure 171 is formed on the surfaces of the sacrificial layers 16 and on the surface of the first isolation structure 15; as shown in (b) of FIG. 13, it can be seen that in BB' direction, the initial second isolation structure 171 is completely formed on the first isolation structure 15; as shown in (c) of FIG. 13, in the top view direction, the initial second isolation structure 171 completely covers the sacrificial layers 16 and the first isolation structure 15.

It should be noted that the initial second isolation structure 171 and the first isolation structure 15 may be of the same material, for example, they both are made of silicon nitride. Therefore, both of them are shown with the same filling in FIG. 13, and a line segment is added at the boundary between the two for convenience of distinguishing. It could be understood that in practice, there is generally no obvious dividing line between the first isolation structure 15 and the initial second isolation structure 171 because the materials of the first isolation structure 15 and the initial isolation structure 171 are the same. The initial second isolation structure 171 may be formed by deposition, such as CVD, PVD or the like.

Figure 14:
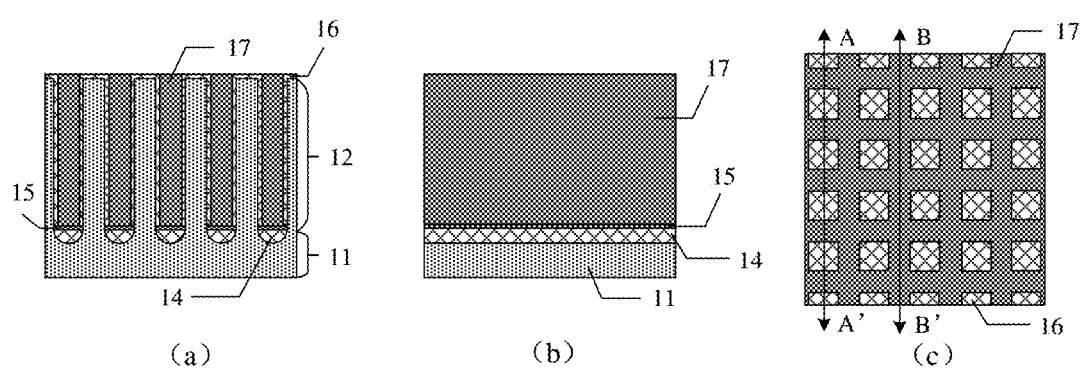
FIG. 14 is a schematic diagram of a structure obtained after forming a second isolation structure provided by embodiments of the disclosure.

After the initial second isolation structure 171 is formed, the initial second isolation structure 171 above a plane where top surfaces of the sacrificial layers 16 are located is removed, and the remaining part of the initial second isolation structure 171 forms the second isolation structure 17. Referring to FIG. 14, FIG. 14 is a schematic diagram of a structure obtained after forming a second isolation structure 17 provided by embodiments of the disclosure.

As shown in (a) of FIG. 14, it can be seen that in AA' direction, the top surface of the second isolation structure 17 is flush with the top surfaces of the sacrificial layers 16; as shown in (b) of FIG. 14, it can be seen that in BB' direction, the second isolation structure 17 is completely formed on the first isolation structure 15; as shown in (c) of FIG. 14, in the top view direction, the sacrificial layers 16 completely covers the silicon pillars 12, thus no silicon pillar 12 can be seen in the top view, and only the sacrificial layers 16 and the second isolation structure 17 in the gaps between the sacrificial layers 16 can be seen.

It should be noted that as shown in FIG. 14, the first isolation structure 15 and the second isolation structure 17 together constitute an isolation structure. The first isolation structure 15 is formed on the surface of the oxide layer 14 and completely covers the oxide layer 14. The first isolation structure 15 is the bottom of the isolation structure. That is, the bottom of the isolation structure completely covers the oxide layer 14.

In addition, the side surfaces of the first isolation structure 15 are in direct contact with the side surfaces of the adjacent silicon pillars 12. That is, the side surfaces of the bottom of the isolation structure are in direct contact with the adjacent silicon pillars.

In this way, the side surfaces of the bottom of the isolation structure is in direct contact with the adjacent silicon pillars 12, so that the silicon pillar 12 can be insulated from other components in the structure to avoid electric leakage.

Figure 15:
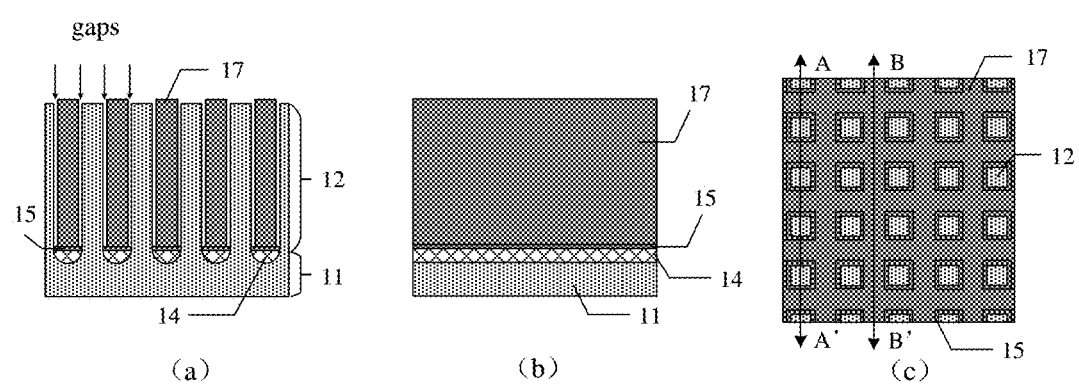
FIG. 15 is a schematic diagram of a structure obtained after removing the sacrificial layer provided by embodiments of the disclosure.

The sacrificial layers 16 are removed, so that the gaps between the isolation structure and the silicon pillars 12 are formed. Referring to FIG. 15, FIG. 15 is a schematic diagram of a structure obtained after removing the sacrificial layers 16 provided by embodiments of the disclosure. As shown in FIGS. 14 and 15, the first isolation structure 15 and the second isolation structure 17 together constitute the isolation structure, and the sacrificial layers 16 are completely removed, and the positions where the sacrificial layers 16 were located form gaps between the isolation structure and the silicon pillars 12, as indicated by arrows in (a) of FIG. 15. Herein, the sacrificial layers 16 may be removed by etching.

As shown in (a) of FIG. 15, it can be seen that in AA' direction, gaps are formed between the isolation structure and the silicon pillars 12; as shown in FIG. 15 (b), in BB' direction, no silicon pillar 12 is presented, and the cross section in BB' direction is not a cross section in which the gaps are formed, so that the gaps are not visible in BB' direction, and only the isolation structure on the oxide layer 14 can be seen; as shown in (c) of FIG. 15, in the top view direction, the silicon pillars 12, the first isolation structure 15, and the second isolation structure 17 can be seen, in which the gaps between the second isolation structure 17 and the silicon pillars 12 expose the first isolation structure 15.

In this way, in the embodiments of the disclosure, gaps formed between the isolation structure and the silicon pillars 12 are obtained by forming sacrificial layers 16 first and then removing the sacrificial layers 16, and the gaps are used for subsequently forming the first conductive layer 18. Furthermore, an isolation structure for insulating has been formed below the gaps. This method is simple, easy to realize, and cost effective.

In S105, a first conductive layer 18 is formed in the gaps.

It should be noted that, after the gaps are formed between the isolation structure and the silicon pillars 12, the first conductive layer 18 is formed in the gaps. Herein, the first conductive layer 18 is used to form a lower electrode of the semiconductor structure.

In some embodiments, forming the first conductive layer 18 in the gaps includes the following operations.

An initial first conductive layer 181 is formed in the gaps and on top surfaces of the plurality of silicon pillars 12 and the isolation structure.

The initial first conductive layer 181 above a plane where top surfaces of the plurality of silicon pillars 12 are located is removed, and the remaining part of the initial first conductive layer 181 forms the first conductive layer 18.

Figure 16:
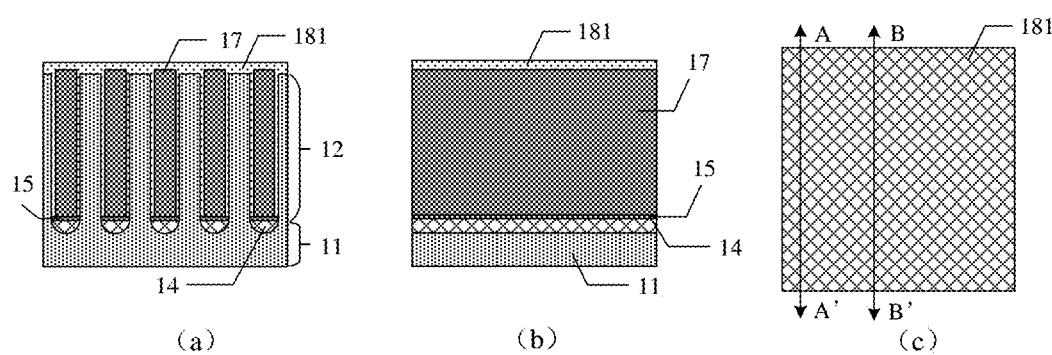
FIG. 16 is a schematic diagram of a structure obtained after forming an initial first conductive layer provided by embodiments of the disclosure.

It should be noted that during forming the first conductive layer 18, an initial first conductive layer 181 is first formed. Referring to FIG. 16, FIG. 16 is a schematic diagram of a structure obtained after forming an initial first conductive layer 181 provided by embodiments of the disclosure. As shown in FIG. 16, the initial first conductive layer 181 is formed in the gaps between the isolation structure and the silicon pillars 12, as well as the top surface of the isolation structure and the top surface of each silicon pillar 12. That is, the initial first conductive layer 181 completely fills the gaps between the isolation structure and each silicon pillar 12 and covers the top surface of the isolation structure and the top surface of each silicon pillar 12.

As shown in (a) of FIG. 16, it can be seen that in AA' direction, the initial first conductive layer 181 completely fills the gaps between the isolation structure and the silicon pillars 12, and the initial first conductive layer 181 is also formed on the top surface of the isolation structure and the top surfaces the silicon pillars 12; as shown in (b) of FIG. 16, it can be seen that in BB' direction, the initial first conductive layer 181 covers the isolation structure; as shown in (c) of FIG. 16, since the initial first conductive layer 181 completely covers the top surface of the isolation structure and the top surface of each silicon pillar 12, only the initial first conductive layer 181 can be seen in the top view direction.

Herein, the material of the initial first conductive layer 181 may be titanium nitride, and the process for forming the initial first conductive structure 181 may be deposition, such as CVD, PVD, or the like.

Figure 17:
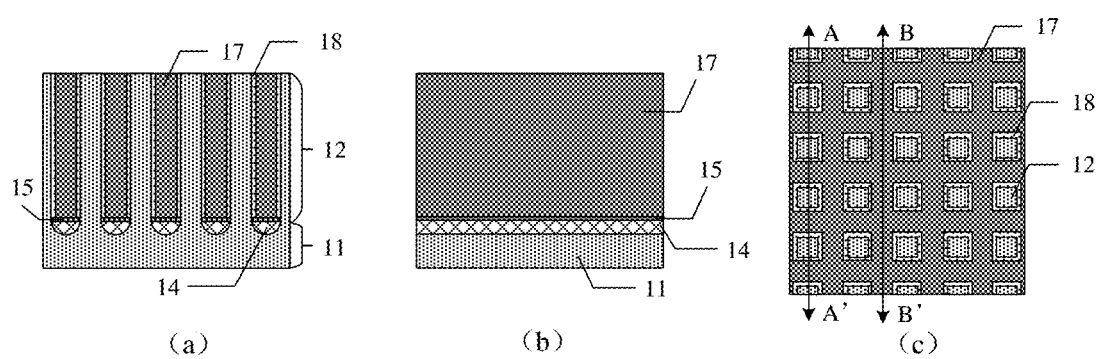
FIG. 17 is a schematic diagram of a structure obtained after forming a first conductive layer provided by embodiments of the disclosure.

The initial first conductive layer 181 is partially removed to obtain a first conductive layer 18. Referring to FIG. 17, FIG. 17 is a schematic diagram of a structure obtained after forming a first conductive layer 18 provided by embodiments of the disclosure. As shown in FIGS. 16 and 17, the initial first conductive layer 181 above a plane where top surfaces of the plurality of silicon pillars 12 are located is removed, and the initial first conductive layer 181 in the gaps between the isolation structure and the silicon pillars 12 is retained to form the first conductive layer 18.

It should be noted that the initial first conductive layer 181 located on the plane where the top surfaces of the silicon pillars 12 are located may be removed by etching or chemical mechanical polishing (CMP). When using CMP, the part of the second isolation structure 17 which is higher than the plane where the top surfaces of the silicon pillars 12 is also removed at the same time.

Thus, in some embodiments, during removing the initial first conductive layer 181 above the plane where the top surfaces of the silicon pillars 12 are located, the method further includes the following operation.

The isolation structure located above the plane where the top surfaces of the silicon pillars 12 are located is removed.

It should be noted that, as shown in FIGS. 16 and 17, the initial first conductive layer 181 and part of the isolation structure above the plane where the top surfaces of the silicon pillars 12 are located (the second isolation structure 17 higher than the plane where the top surfaces of the silicon pillars 12 are located) are removed.

In this way, the initial first conductive layer 181 and the isolation structure higher than the plane where the top surfaces of the silicon pillars 12 are located are removed simultaneously by CMP, which simplifies the process and reduces the cost.

As shown in (a) of FIG. 17, it can be seen that in AA direction, the top surfaces of the isolation structure (mainly the second isolation structure 17), the first conductive layer 18, and the silicon pillars 12 are flush; as shown in FIG. 17 (b), it can be seen that in BB' direction, there is no silicon pillars 12, and the isolation structure after being partially removed can be seen; as shown in FIG. 17 (c), in the top view direction, it can be seen that the first conductive layer 18 surrounds the silicon pillars 12, the remaining area is the isolation structure, and the isolation structure that can be seen in the top view is the second isolation structure 17.

In S106, the isolation structure is partially removed, and the isolation structure below the first conductive layer is retained to form an isolation layer.

It should be noted that after the first conductive layer 18 is formed, the isolation structure is partially removed so that only the isolation structure below the first conductive layer 18 is retained, and the remaining isolation structure forms the isolation layer 19.

In some embodiments, partially removing the isolation structure includes the following operation.

The second isolation structure 17 is removed, and the first isolation structure 15 below the second isolation structure 17 is removed, and the first isolation structure 15 below the first conductive layer 18 is retained.

Figure 18:
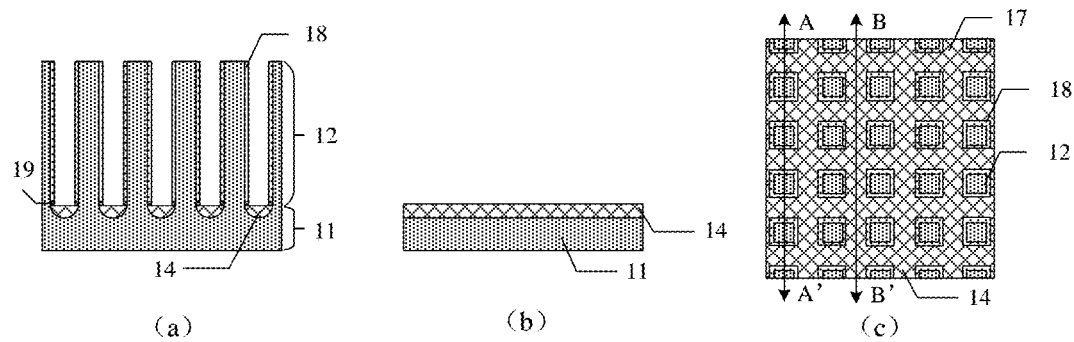
FIG. 18 is a schematic diagram of a structure obtained after forming an isolation layer provided by embodiments of the disclosure.

It should be noted that referring to FIG. 18, FIG. 18 is a schematic diagram of a structure obtained after forming an isolation layer 19 provided by embodiments of the disclosure. As shown in FIGS. 17 and 18, the second isolation structure 17 and the first isolation structure 15 located below the second isolation structure 17 are removed, and the remaining first isolation structure 15 below the first conductive layer 18 forms the isolation layer 19.

As shown in (a) of FIG. 18, in AA' direction, both the second isolation structure 17 and the first isolation structure 15 located below the second isolation structure 17 are removed, and the first isolation structure 15 located below the first conductive layer 18 is retained to form the isolation layer 19; as shown in (b) of FIG. 18, in BB' direction, there is no silicon pillars 12, and the isolation structures in this direction are removed, so that only the substrate layer 11 and the oxide layer 14 can be seen in BB' direction; as shown in (c) of FIG. 18, in the top view direction, it can be seen that the first conductive layer 18 surrounds the silicon pillars 12, and the remaining area is the oxide layer 14 exposed by the gap between the first conductive layer 18.

It could be understood that under the first conductive layer 18, the isolation layer 19 also surrounds the silicon pillars 12. That is, on the side surfaces of each silicon pillar 12, the lower part of the side surfaces is formed with the isolation layer 19 surrounding the silicon pillar 12, and the isolation layer 19 is in direct contact with the lower part of the side surfaces of the surrounding silicon pillar 12; the upper part of the side surfaces is formed with the first conductive layer 18 surrounding the silicon pillar 12, and the conductive layer 18 is also in direct contact with the upper part of the side surfaces of the surrounding silicon pillar 12. In this way, the isolation layer 19 insulates the first conductive layer 18 from the substrate, that is, the lower electrode is insulated from the substrate, thereby preventing the occurrence of electric leakage.

It should also be noted that, in embodiments of the disclosure, materials of the first isolation structure 15 and the second isolation structure 17 are the same. Since the first isolation structure 15 and the second isolation structure 17 are made of the same material, when the isolation structure is removed, for example, by etching, the same etching selective ratio can be selected to remove the second isolation structure 17 and the first isolation structure 15 located below the second isolation structure 17 at the same time without performing multiple etching processes and adjusting additional etching parameters, thus simplifying the process flow and saving the cost.

In S107, a dielectric layer 20 and a second conductive layer 21 are formed on surfaces of the isolation layer 19, the oxide layer 14, the first conductive layer 18 and the silicon pillars 12

It should be noted that after the isolation layer 19 is formed, the dielectric layer 20 and the second conductive layer 21 are further formed.

In some embodiments, forming the dielectric layer 20 and the second conductive layer 21 on the surfaces of the isolation layer 19, the oxide layer 14, the first conductive layer 18 and the silicon pillars 12 includes the following operations.

A dielectric layer 20 is formed on surfaces of the isolation layer 19, the oxide layer 14, the first conductive layer 18 and the silicon pillars 12

The second conductive layer 21 is formed on the surface of the dielectric layer 20.

Figure 19:
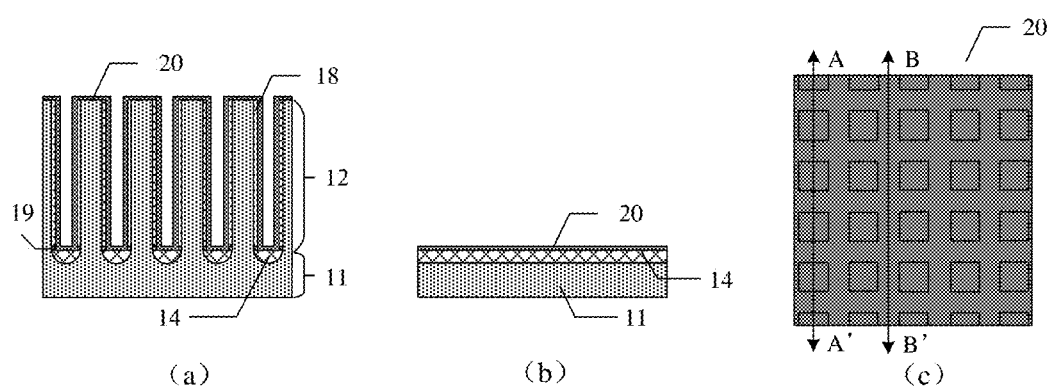
FIG. 19 is a schematic diagram of a structure obtained after forming a dielectric layer provided by embodiments of the disclosure.

It should be noted that referring to FIG. 19, FIG. 19 is a schematic diagram of a structure obtained after forming a dielectric layer 20 provided by embodiments of the disclosure. As shown in FIG. 19, the dielectric layer 20 is formed on the surfaces of the isolation layer 19, the oxide layer 14 and each of the silicon pillars 12.

As shown in (a) of FIG. 19, it can be seen in AA' direction that the dielectric layer 20 is formed on the surfaces of the oxide layer 14, the first conductive layer 18 and each of the silicon pillars 12; as shown in (b) of FIG. 19, there is no silicon pillar 12 in BB' direction, and therefore the dielectric layer 20 is formed on the surface of the oxide layer 14 in BB' direction; as shown in (c) of FIG. 19, in the top view direction, since the dielectric layer 20 completely covers the isolation layer 19, the oxide layer 14, the first conductive layer 18, and the silicon pillars 12, only the dielectric layer 20 can be seen. In (c), the dielectric layer 20 covering the top surfaces of the silicon pillars 12 and the first conductive layer 18 is shown in a box in order to distinguish the dielectric layer 20 formed on different surfaces.

Herein, the material of the dielectric layer 20 may be a high dielectric constant (High K) material, such as hafnium oxide, zirconium oxide, lanthanum oxide, alumina, hafnium silicon oxide, hafnium nitrogen oxide, and the like. The dielectric layer 20 may be formed by deposition, such as CVD, PVD or the like.

Figure 20:
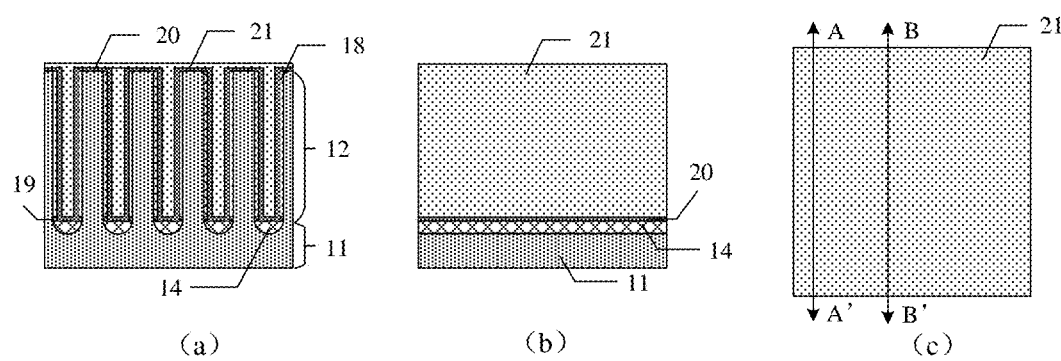
FIG. 20 is a schematic structural diagram of the composition of a semiconductor structure provided by embodiments of the disclosure.

After the dielectric layer 20 is formed, the second conductive layer 21 is formed on the surface of the dielectric layer 20. Referring to FIG. 20, FIG. 20 is a schematic diagram of the composition of a semiconductor structure 100 provided by embodiments of the disclosure. As shown in FIG. 20, the second conductive layer 21 is formed on the surface of the dielectric layer 20.

As shown in (a) of FIG. 20, in AA' direction, the second conductive layer 21 is formed on the surface of the dielectric layer 20; as shown in (b) of FIG. 20, in BB' direction, since there is no silicon pillar 12 in this direction, only the second conductive layer 21 can be seen on the dielectric layer 20; as shown in (c) of FIG. 20, in the top view direction, it can be seen that the second conductive layer 21 completely covers the dielectric layer 20.

In addition, the second conductive layer 21 and the first conductive layer 18 may be of the same material, for example titanium nitride. Therefore, they both are shown with the same filling in FIG. 20. Further, the second conductive layer 21 may be formed by deposition, such as CVD, PVD or the like.

As shown in FIG. 20, the second conductive layer 21 completely fills the gap of the dielectric layer 20.

It should be noted that as specifically shown in (b) of FIG. 20, the second conductive layer 21 completely fills the gap of the dielectric layer 20.

Herein, the second conductive layer 21 is used for forming an upper electrode.

It should be noted that the semiconductor structure 100 may be a capacitor, herein the first conductive layer 18 is used for forming a lower electrode of the capacitor, the second conductive layer 21 is used for forming an upper electrode of the capacitor, and the dielectric layer 20 is a dielectric layer between the upper electrode and the lower electrode.

Figure 21:
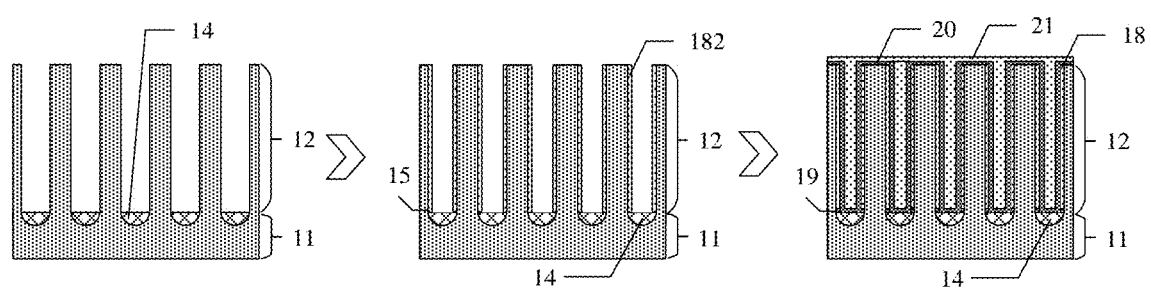
FIG. 21 is a simplified diagram of a process for forming a semiconductor structure provided by embodiments of the disclosure.

For comparison, referring to FIG. 21, FIG. 21 is a simplified diagram of a process for forming a semiconductor structure provided by embodiments of the disclosure, which differs from the aforementioned method for manufacturing a semiconductor structure. As shown in FIG. 21, in this method, after the oxide layer 14 is formed, a titanium nitride layer 182 is formed on the side surfaces of a plurality of silicon pillars 12 by selective atomic layer deposition (Selective ALD) of titanium nitride, and then the part of the bottom of the titanium nitride layer 182 in contact with the oxide layer 14 is removed to form an isolation layer 19 and other components. The process implementation of this method is difficult and the cost is high.

In contrast, a substrate is provided; the substrate is patterned to form a substrate layer and a plurality of silicon pillars; an oxide layer is formed on a surface of the substrate layer between the plurality of silicon pillars; an isolation structure is formed on the oxide layer, and gaps are provided between an upper part of the isolation structure and the silicon pillars; a first conductive layer is formed in the gaps; the isolation structure is partially removed, the isolation structure below the first conductive layer is retained to form an isolation layer; a dielectric layer and a second conductive layer are formed on surfaces of the isolation layer, the oxide layer, the first conductive layer and the silicon pillars. In this way, when manufacturing a semiconductor structure, gaps formed between the silicon pillar and the isolation structure, and a first conductive layer is formed in the gaps, then the isolation structure is partially removed to obtain the isolation layer, and then a dielectric layer and a second conductive layer are further formed. This manufacturing method has a simple process, is easy to implement, and the cost of manufacturing a semiconductor structure can be saved. In practice, the process is easier to implement.

Based on the method for manufacturing a semiconductor structure above-mentioned, the embodiments of the disclosure also provides a semiconductor structure, which is prepared by the manufacturing method described in any of the preceding embodiments. For example, reference is made to FIG. 20, which is a schematic diagram of the composition of the semiconductor structure 100 provided by embodiments of the disclosure.

In some embodiments, the semiconductor structure 100 includes a capacitor where the upper electrode of the capacitor is the first conductive layer 18 and the lower electrode of the capacitor is the second conductive layer 20.

For this semiconductor structure 100, since the semiconductor structure 100 is prepared by the method for manufacturing a semiconductor structure described in the foregoing embodiment, the cost of manufacturing the semiconductor structure 100 is low, and the semiconductor structure 100 can be applied to a 3D memory with a higher integration, which is beneficial to the integration of the memory.

Figure 22:
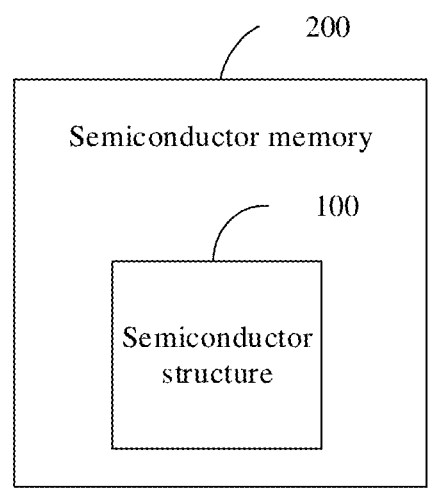
FIG. 22 is a schematic diagram of the composition of a semiconductor memory provided by embodiments of the disclosure.

In yet another embodiment, reference is made to FIG. 22, which is a schematic diagram of the composition of a semiconductor memory 200 provided by embodiments of the disclosure. As shown in FIG. 22, the semiconductor memory 200 includes the semiconductor structure 100 described in the foregoing embodiments.

In some embodiments, the semiconductor memory 200 may be a 3D DRAM.

For this semiconductor memory 200, since it includes the semiconductor structure 100 provided in the foregoing embodiments, a semiconductor memory with higher integration and precision can be obtained, which is beneficial to the integration of the semiconductor memory.

The description above is only preferred embodiments of the disclosure, and is not intended to limit the protection scope of the present disclosure.

It should be noted that, in the disclosure, the terms "including", "comprising" or any other variation thereof are intended to encompass non-exclusive inclusion, so that a process, a method, an article or a device that includes a set of elements includes not only those elements but also other elements that are not explicitly listed, or also elements inherent to such a process, method, article or device. In the absence of further limitations, an element defined by the phrase "includes a . . . " does not exclude the existence of another identical element in the process, method, article or device in which the elements is included.

The above serial numbers of the embodiments of the present disclosure are for description only and do not represent the advantages and disadvantages of the embodiments.

The method disclosed in the embodiments of several methods provided in the disclosure can be arbitrarily combined as long as there is no conflict therebetween to obtain a new embodiment of a method.

The features disclosed in the embodiments of several products provided in the disclosure can be arbitrarily combined as long as there is no conflict therebetween to obtain a new embodiment of a product.

The features disclosed in the embodiments of several methods or devices provided in the disclosure can be arbitrarily combined as long as there is no conflict therebetween to obtain a new embodiment of a method or a device.

The descriptions above are only some specific embodiments of the present disclosure, and are not intended to limit the scope of protection of the embodiments of the present disclosure. Any change and replacement is easily to think within the technical scope of the embodiments of the present by those skilled in the art, and fall with the protection scope of the present disclosure. Therefore, the scope of protection of the embodiments of the present disclosure shall be subject to the scope of protection of the claims.

What is claimed is:

1. A method for manufacturing a semiconductor structure, comprising:
    providing a substrate;
    patterning the substrate to form a substrate layer and a plurality of silicon pillars;
    forming an oxide layer on a surface of the substrate layer between the plurality of silicon pillars;
    forming an isolation structure on the oxide layer, gaps being provided between upper part of the isolation structure and the silicon pillars;
    forming a first conductive layer in the gaps;
    partially removing the isolation structure and retaining the isolation structure below the first conductive layer to form an isolation layer; and
    forming a dielectric layer and a second conductive layer on surfaces of the isolation layer, the oxide layer, the first conductive layer and the silicon pillars.

2. The method according to claim 1, wherein the patterning the substrate to form a substrate layer and a plurality of silicon pillar comprises:
    forming a first mask layer on the substrate, wherein the first mask layer has a first pattern extending in a first direction;
    transferring the first pattern to part of the substrate by taking the first mask layer as a mask;
    forming a second mask layer on the substrate, wherein the second mask layer has a second pattern extending in a second direction; and
    transferring the second pattern to part of the substrate by taking the second mask layer as a mask to form the substrate layer and the plurality of silicon pillars.

3. The method according to claim 1, wherein the patterning the substrate to form a substrate layer and a plurality of silicon pillars comprises:
    forming a third mask layer on the substrate, the third mask layer comprising a plurality of sub-masks arranged in an array, and the third mask layer having a third pattern composed of a first pattern extending in a first direction and a second pattern extending in a second direction; and
    transferring the third pattern to part of the substrate by taking the third mask layer as a mask to form the substrate layer and the plurality of silicon pillars.

4. The method according to claim 1, wherein the forming an oxide layer on a surface of the substrate layer between the plurality of silicon pillars comprises:
    forming an initial oxide layer on surfaces of the plurality of silicon pillars and a surface of the substrate layer between the plurality of silicon pillars; and
    removing the initial oxide layer on the surfaces of the plurality of silicon pillars, remaining initial oxide layer forming the oxide layer.

5. The method according to claim 1, wherein the forming an isolation structure on the oxide layer comprises:
    forming a first isolation structure on a surface of the oxide layer; and
    forming a second isolation structure on the first isolation structure, the gaps being provided between the second isolation structure and the silicon pillars, and the first isolation structure and the second isolation structure constituting the isolation structure.

6. The method according to claim 5, wherein the forming a first isolation structure on a surface of the oxide layer comprises:
    forming an initial first isolation structure on the surface of the oxide layer and a surface of each of the silicon pillars; and
    partially removing the initial first isolation structure, remaining initial first isolation structure on the surface of the oxide layer forming the first isolation structure.

7. The method according to claim 5, wherein the forming a second isolation structure on the first isolation structure comprises:
    forming sacrificial layers on surfaces the plurality of silicon pillars;
    forming an initial second isolation structure on surfaces of the sacrificial layers and on the first isolation structure;
    removing the initial second isolation structure above a plane where top surfaces of the sacrificial layers are located, remaining initial second isolation structure forming the second isolation structure; and
    removing the sacrificial layers to form the gaps between the isolation structure and the silicon pillars.

8. The method according to claim 5, wherein the partially removing the isolation structure comprises:
    removing the second isolation structure and removing the first isolation structure below the second isolation structure, retaining the first isolation structure below the first conductive layer.

9. The method according to claim 7, wherein the sacrificial layers are formed by thermal oxidation.

10. The method according to claim 1, wherein the forming a first conductive layer in the gaps comprises:
    forming an initial first conductive layer in the gaps and on top surfaces of the plurality of silicon pillars and the isolation structure; and
    removing the initial first conductive layer above a plane where top surfaces of the silicon pillars are located, remaining initial first conductive layer forming the first conductive layer.

11. The method according to claim 10, during the removing the initial first conductive layer above a plane where top surfaces of the silicon pillars are located, further comprising:
    removing the isolation structure located above the plane where the top surfaces of the silicon pillars are located.

12. The method according to claim 1, wherein the forming a dielectric layer and a second conductive layer on surfaces of the isolation layer, the oxide layer, the first conductive layer and the silicon pillars comprises:
    forming the dielectric layer on the surfaces of the isolation layer, the oxide layer, the first conductive layer and the silicon pillars; and
    forming the second conductive layer on a surface of the dielectric layer.

13. The method according to claim 12, wherein the second conductive layer completely fills gaps of the dielectric layer.

14. The method according to claim 1, wherein materials of the first isolation structure and the second isolation structure are the same.

15. The method according to claim 1, wherein a bottom of the isolation structure completely covers the oxide layer.

16. The method according to claim 1, wherein sides of a bottom of the isolation structure are in direct contact with adjacent silicon pillars.

17. The method according to claim 1, wherein the first conductive layer is used to form a lower electrode of the semiconductor structure, and the second conductive layer is used to form an upper electrode of the semiconductor structure.

18. The method according to claim 1, wherein the plurality of silicon pillars are arranged in an array.

19. A semiconductor structure manufactured by the method for manufacturing a semiconductor structure according to claim 1.

20. A semiconductor memory comprising the semiconductor structure according to claim 19.

* * * * *